United States Patent [19]

Rohde et al.

[11] Patent Number: 4,851,506
[45] Date of Patent: Jul. 25, 1989

[54] PHOTOSTRUCTURABLE POLYIMIDE MIXTURES

[75] Inventors: Ottmar Rohde, Basel; André-Etienne Perret, Les Geneveys-sur-Coffrane; Josef Pfeifer, Therwil, all of Switzerland

[73] Assignee: Ciba-Geigy Corporation, Ardsley, N.Y.

[21] Appl. No.: 135,813

[22] Filed: Dec. 21, 1987

[30] Foreign Application Priority Data

Dec. 29, 1986 [CH] Switzerland ............ 5225/86

[51] Int. Cl.$^4$ .............................. C08G 69/26
[52] U.S. Cl. .................................. 528/353; 528/125; 528/126; 528/128; 528/172; 528/185; 528/189; 528/352
[58] Field of Search ............... 528/353, 125, 126, 128, 528/172, 185, 189, 352

[56] References Cited

U.S. PATENT DOCUMENTS

| | | | |
|---|---|---|---|
| 3,793,291 | 2/1974 | Cohen | 528/26 |
| 3,933,745 | 1/1976 | Bargain et al. | 528/188 |
| 4,629,777 | 12/1986 | Pfeifer | 528/353 |
| 4,656,116 | 4/1987 | Rohde et al. | 430/197 |
| 4,657,832 | 4/1987 | Pfeifer | 430/118 |
| 4,680,195 | 7/1987 | Pfeifer | 427/44 |
| 4,698,295 | 10/1987 | Pfeifer et al. | 430/325 |

FOREIGN PATENT DOCUMENTS 0077718  4/1983  European Pat. Off. .

OTHER PUBLICATIONS

Chem. Abst. 99, 89072q (1983).
Proceedings of Second International Conference on Polyimides, pp. 75–85 (1985).

*Primary Examiner*—John Kight
*Assistant Examiner*—M. L. Moore
*Attorney, Agent, or Firm*—Luther A. R. Hall

[57] ABSTRACT

The present invention relates to compositions comprising (a) at least one polyimide having an inherent viscosity of at least 0.1 dl/g (measured at 25° C. on a 0.5% by weight solution in N-methylpyrrolidone) and containing at least 50 mol % of structural units of the formula I

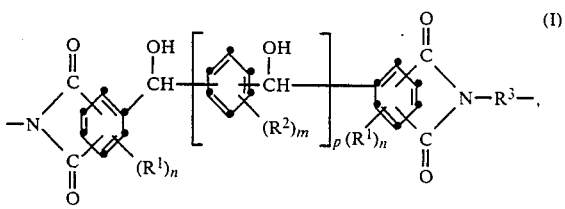

in which m and p independently of one another are integers from 0 to 4, n is an integer from 0 to 3, $R^1$ and $R^2$ independently of one another are $C_1$–$C_6$-alkyl or $C_1$–$C_6$-alkoxy and $R^3$ is a divalent radical of an aromatic diamine which is substituted in at least one ortho-position relative to at least one N atom by alkyl, alkoxy, alkoxyalkyl, cycloalkyl or aralkyl or in which two adjacent C atoms of the aromatic radical are substituted by alkylene, and (b) at least one aromatic polyimide which is soluble in organic solvents and photocrosslinkable and which contains at least 50 mol %, relative to the total quantity of diamine units, of radicals $R^3$ and at least 50 mol %, relative to the total quantity of aromatic tetracarboxylic acid units, of tetravalent aromatic tetracarboxylic acid radicals including at least one benzophenone unit.

The polyimide mixtures are distinguished by good adhesion to various substrates and have a high photosensitivity. They can be used for the production of protective coatings and relief structures and are particularly suitable for the production of etch masks.

14 Claims, No Drawings

PHOTOSTRUCTURABLE POLYIMIDE MIXTURES

The present invention relates to polyimides based on benzhydroltetracarboxylic acid (derivatives) and selected diamine radicals, to compositions containing soluble, photostructurable polyimides and said benzhydrol-polyimides, to a process for the production of protective coatings and relief images and to the use of said polyimide mixtures for the production of insulating, passivating and protective layers and of relief images.

Polyimides which are soluble and at the same time photostructurable are known. Auto-photocrosslinkable polyimides are described in EP-A 132,221, 134,752, 162,017 and 181,837.

EP-A 92,524 and 141,781 have disclosed radiation-sensitive coating agents which contain a soluble polyimide and at least one crosslinking agent, for example an organic polyazide.

Photostructurable polyimides are of potential interest as protective layers or etch masks in the manufacture of electronic components. Layers of these materials are highly heat-resistant and chemically inert so that they can be used even in process steps where high temperatures and aggressive chemical conditions apply.

However, the adhesive strength of a number of polyimides is not satisfactory on various substrates. For this reason, so-called adhesion promoters are used which as a rule must be matched to the particular system (substrate/polyimide). However, the adhesion of layers modified in this way is not in every case adequate. Thus, it is found that, in etching processes with aggressive media, for example with hydrofluoric acid, etch masks are attacked at the substrate/polyimide interface, the protective layer is partially detached or the substrate surface which is to be protected is severely etched. Under such conditions, the adhesion is thus unsatisfactory, and etching processes using such systems are not possible or etched patterns of low resolution result.

Therefore, an etching process, for example the use of hydrofluoric acid, can also be used for determining the adhesive strength of a polyimide layer on substrates, for example $SiO_2$.

Polyimides based on benzhydroltetracarboxylic acids or derivatives thereof are known from EP-A 77,718 or U.S. Pat. Nos. 3,933,745 and 3,793,291. These compounds are readily soluble in organic solvents and are distinguished by good adhesion to various substrates. However, these polyimides are not photocrosslinkable.

The use of mixed systems of photostructurable polyimides, especially the polyimides of the abovementioned patent applications and patents, and other polymers, especially adhesion-promoting polymers, raises some problems. As a rule, the photosensitivity of the mixed system falls from that of the pure photocrosslinkable polyimide to an intolerable level or the heat stability of the mixture leaves something to be desired. Moreover, the use of more than one polymer component can cause problems in the production of highly resolved relief structures, because the mixture is not homogeneous and, therefore, a uniformly structured film is not formed.

A selected class of polyimides has now been found which can be combined with selected photostructurable polyimides to give heat-stable mixtures of good adhesion and good photosensitivity.

The present invention relates to compositions comprising (a) at least one polyimide having an inherent viscosity of at least 0.1 dl/g (measured at 25° C. on a 0.5% by weight solution in N-methyl-pyrrolidone) and containing at least 50 mol % of structural units of the formula I

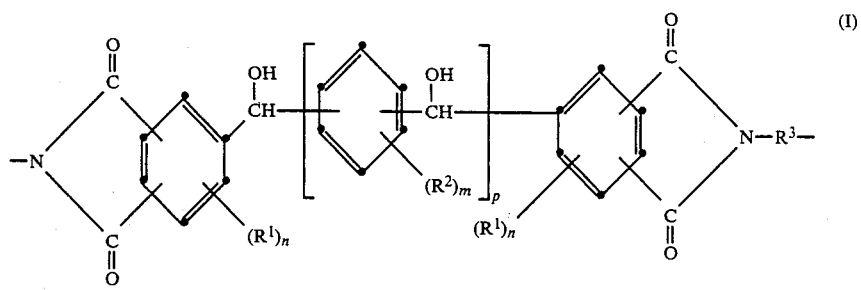

in which m and p independently of one another are integers from 0 to 4, n is an integer from 0 to 3, $R^1$ and $R^2$ independently of one another are $C_1$-$C_6$-alkyl or $C_1$-$C_6$-alkoxy and $R^3$ is a divalent radical of an aromatic diamine which is substituted in at least one ortho-position relative to at least one N atom by alkyl, alkoxy, alkoxyalkyl, cycloalkyl or aralkyl or in which two adjacent C atoms of the aromatic radical are substituted by alkylene, and (b) at least one aromatic polyimide which is soluble in organic solvents and is photocrosslinkable and which contains at least 50 mol %, relative to the total quantity of the diamine units in this component, of radicals as defined for $R^3$ and at least 50 mol %, relative to the total quantity of the aromatic tetracarboxylic acid units in this component, of tetravalent aromatic tetracarboxylic acid radicals including at least one benzophenone unit.

The term "polyimide soluble in organic solvents and photocrosslinkable" comprises both soluble and auto-photocrosslinkable polyimides as defined above and combinations of these polyimides with a radiationactivated crosslinking agent. The term "tetravalent aromatic tetracarboxylic acid radical including at least one benzophenone unit" comprises groups which contain one or more structural elements of the formula

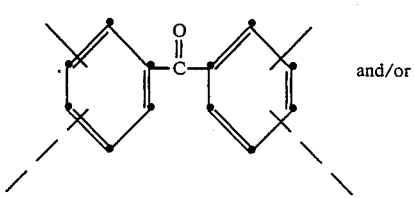 and/or

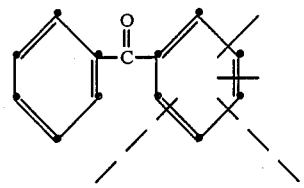

These groups are here bound via the valencies—or via the valencies— and to - - - further aromatic radicals or are condensed into aromatic or partially hydrogenated aromatic systems which in turn carry four carboxyl groups capable of forming two imide rings with amines, or these groups carry, via the valencies— and - - -, four carboxyl groups which can form two imide rings together with amines. Preferred polyimides and polyimide mixtures which can be employed as the component (b) are described in the EP-As mentioned above.

Preferred components (b) in the compositions according to the invention are polyimides or mixtures of such polymides containing at least 50 mol % of structural elements of the formula II

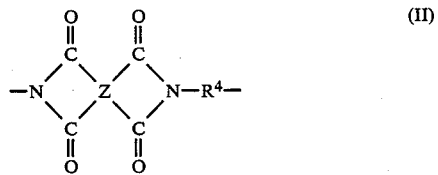

(II)

in which Z is a tetravalent aromatic radical of the formulae III, IV, V and/or VI, wherein in each case two of the free valencies are bound in the ortho-position or peri-position relative to one another

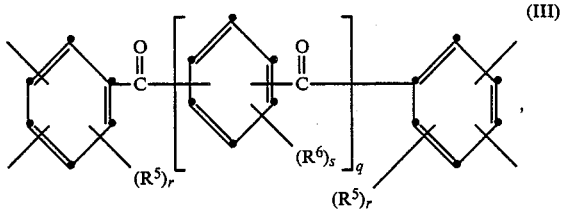

(III)

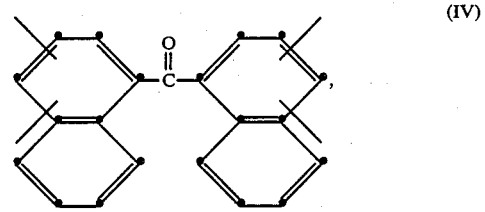

(IV)

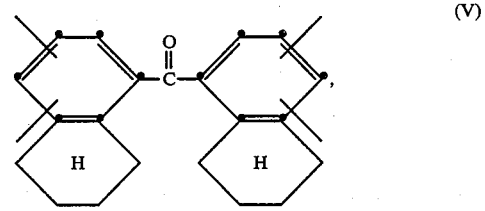

(V)

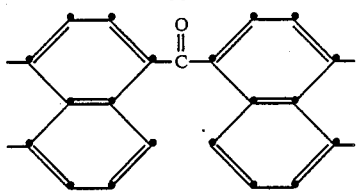

(VI)

in which $R^5$ and $R^6$ independently of one another are $C_1$-$C_6$-alkyl or $C_1$-$C_6$-alkoxy, q and s independently of one another are integers from 0 to 4, r is an integer from 0 to 3 and $R^4$ is a divalent radical of an aromatic diamine which is substituted in two ortho-positions relative to at least one N atom by alkyl, alkoxy, alkoxyalkyl, cycloalkyl or aralkyl, or in which two adjacent C atoms of the aromatic radical are substituted by alkylene.

These polyimides are known from EP-A-132,221, -162,017 and -181,837.

Any alkyl radicals are straight-chain or branched groups. $C_1$-$C_6$-Alkyl groups are preferred. Examples of these are methyl, ethyl, propyl, isopropyl, n-butyl, sec.-butyl, n-pentyl or n-hexyl. Methyl is the particularly preferred alkyl radical.

Any cycloalkyl radicals are as a rule monocyclic radicals having 5 or 6 ring carbon atoms. Cyclohexyl is preferred.

Any alkoxy radicals are straight-chain or branched groups. $C_1$-$C_6$-Alkoxy groups are preferred. Examples of these are methoxy, ethoxy, n-propoxy, isopropoxy, n-butoxy, sec.-butoxy, n-pentyloxy or n-hexyloxy. Methoxy is particularly preferred.

Any alkoxyalkyl radicals are straight-chain or branched radicals. Alkoxyalkyl groups having 2 to 6 C atoms are preferred. Examples of these are methoxymethyl, methoxyethyl, ethoxymethyl, ethoxyethyl or n-propoxypropyl.

Any aralkyl radicals are as a rule benzyl groups or substituted benzyl groups, examples being benzyl, α-methylbenzyl or α,α-dimethylbenzyl. Benzyl is preferred.

If two adjacent C atoms of an aromatic radical are substituted by alkylene, these substituents as a rule are trimethylene or tetramethylene, and preferably tetramethylene.

Preferred components (b) are polyimides which contain at least 90 mol % of structural elements of the formula II as defined above, in which Z is a radical of the formula IIIa, IIIb or IIIc or a mixture of these radicals

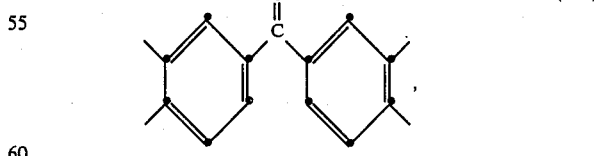

(IIIa)

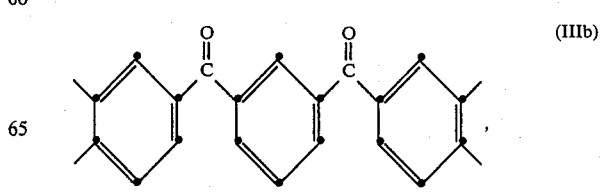

(IIIb)

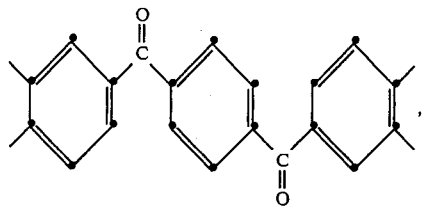
(IIIc)

and in which $R^4$ is a divalent radical of an aromatic diamine which is substituted in two ortho-positions relative to at least one N atom by $C_1$–$C_6$-alkyl.

In a particularly preferred embodiment, the compositions according to the invention contain, as the components (b), polyimides having the structural element of the formula II as defined above, in which $R^4$ is a radical of the formula VII, VIII and/or IX

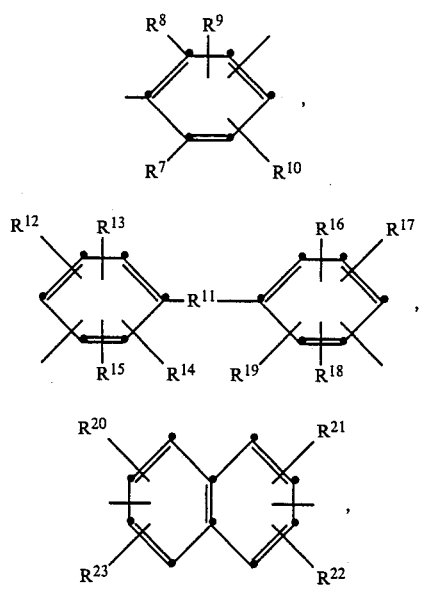

(VII)

(VIII)

(IX)

in which the radicals $R^7$ to $R^{10}$ and $R^{12}$ to $R^{23}$ independently of one another are hydrogen or $C_1$–$C_6$-alkyl and $R^{11}$ is a direct C—C bond, —CH$_2$—, —C(CH$_3$)$_2$—, —C(CF$_3$)$_2$—, —O—, —CO— or —SO$_2$—, with the proviso that each radical of the formula VII, VIII or IX carries at least two $C_1$–$C_6$-alkyl radicals which are bound in the two ortho-positions relative to a free valency.

Particularly preferred components (b) are polyimides which contain at least 90 mol % of structural elements of the formula II, in which $R^4$ is a radical of the formulae VIIa, VIIb, VIIc or VIIIa or a mixture of such radicals

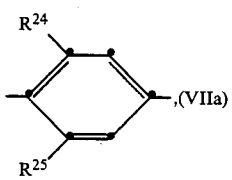
,(VIIa)

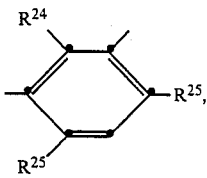
(VIIb)

(VIIc)

(VIIIa)

in which $R^{24}$ and $R^{25}$ are $C_1$–$C_6$-alkyl.

Very particularly preferred compositions of this invention contain, as component (b), polyimides which consist of recurring structural units of the formula II.

The radicals $R^5$ and $R^6$ are preferably methyl, ethyl or methoxy, but with very particular preference are methyl.

The indices q, r and s are preferably 0 or 1, but with very particular preference 0.

If copolyimides which contain at least 50 mol % of structural elements of the formula I or of the formula II are used as the components (a) and/or (b), the co-component as a rule represents aromatic polyimide radicals of the formula IIa $$\underset{\underset{O}{\overset{\overset{O}{\|}}{C}}}{\overset{\underset{O}{\overset{\overset{O}{\|}}{C}}}{-N}}\diagdown Z' \diagup N-R^{4'}-,$$

(IIa)

in which Z' is a tetravalent aromatic radical in which two of the free valencies are in each case in the ortho-position or peri-position relative to one another and $R^{4'}$ is a divalent radical of an aromatic diamine. Such aromatic co-components are known per se and are described, for example, in the above-quoted EP-A relating to polyimides.

Examples of radicals Z' are

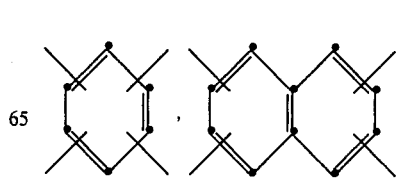

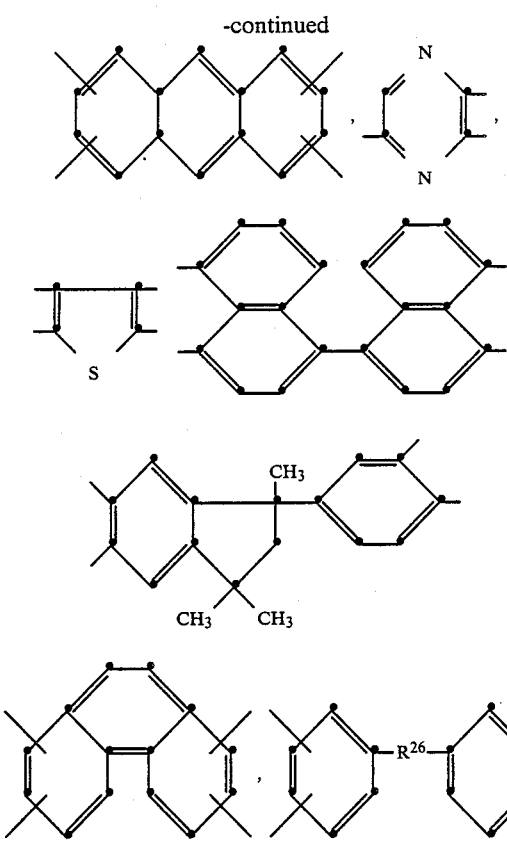

in which R²⁶ is a direct bond or a bridge group of the formulae —CH₂—, —C(CH₃)₂—, —O—, —S—, —SO₂—, —NH—, —C(CF₃)₂— or —Si(CH₃)₂—.

Examples of radicals R⁴' are divalent aromatic hydrocarbon radicals having 6 to 24 C atoms. These are preferably phenylene or naphthalene radicals which can be substituted or unsubstituted. Examples of substituents are $C_1$–$C_6$-alkyl, $C_1$–$C_6$-alkoxy or halogen atoms such as chlorine. Preferred radicals R⁴' are groups of the formula IIb

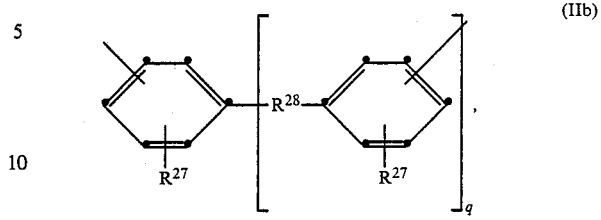

in which $R^{27}$ is hydrogen or $C_1$–$C_6$-alkyl, q is 0 or 1 and $R^{28}$ is as defined for $R^{26}$.

Further preferred radicals R⁴' are the radicals listed above under the formulae VII, VIII and IX.

Preferred compositions contain, as the component (a), (co)-polyimides of the formula I in which p is 0 or 1, but especially is 0, R³ is a radical of the formula VIII defined above and R¹¹ is —CO—.

These compositions are distinguished by particularly high photosensitivity.

The polyimides containing at least 50 mol % of structural units of the formula I (component a), in which R³ is a divalent radical of an aromatic diamine which is substituted in two ortho-positions relative to at least one N atom by alkyl, alkoxy, alkoxyalkyl, cycloalkyl or aralkyl or in which two adjacent C atoms of the aromatic radical are substituted by alkylene, are novel and are also a subject of the invention.

The indices n and m are preferably 0.

The index p is preferably 0 or 1, and particularly preferably 0.

The radicals R¹ and R² are preferably methyl or methoxy, but especially methyl.

Those polyimides are very particularly preferred which consist of recurring structural units of the formula I.

Further preferred polyimides contain at least 50 mol %, especially 100 mol %, of structural units of the formula X, XI and/or XII,

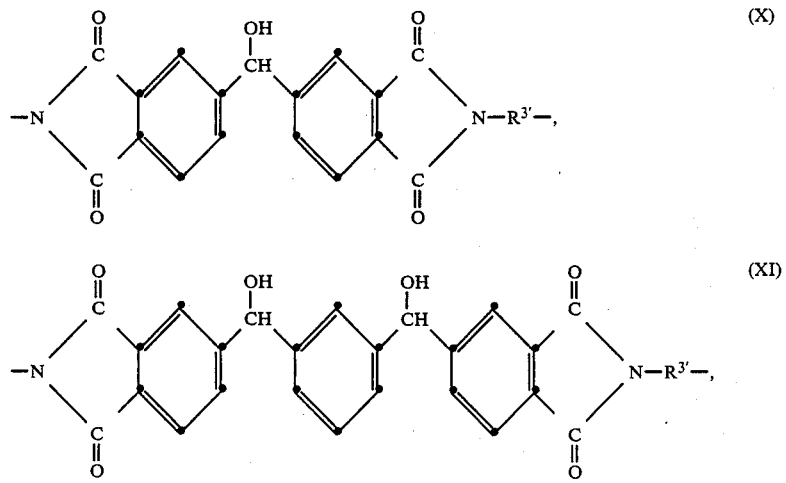

-continued

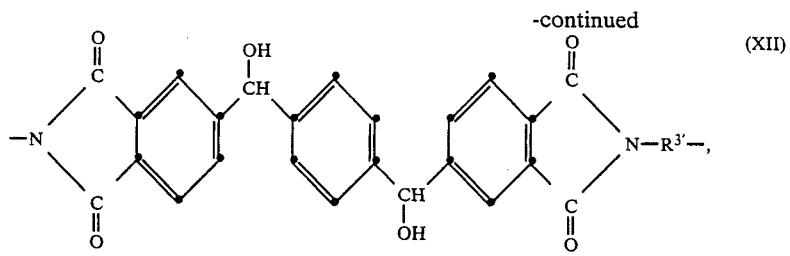

in which R³' is as defined as for residue R⁴.

With very particular preference, R³ is a divalent aromatic radical which is substituted in two ortho-positions relative to at least one N atom by $C_1$–$C_6$-alkoxy or $C_1$–$C_6$-alkoxy, especially by $C_1$–$C_6$-alkyl.

Particularly preferred radicals R³ of this type are groups of the formulae VII, VIII and IX and especially of the formulae VIIa, VIIb, VIIc and VIIIa, as already defined above as preferred for R⁴.

A further, particularly preferred radical R³ is of the formula VIIIb

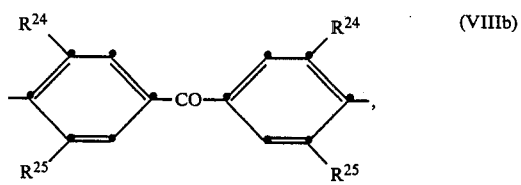

in which R²⁴ and R²⁵ are as defined above.

Copolyimides containing the structural element of the formulae I contain, as the co-components, as a rule aromatic imide groups, for example structural elements of the formula IIa as defined above. The (co)-polyimides containing the structural element of the formula I can be prepared by processes known per se, for example by condensation of the corresponding tetracarboxylic acid half-esters with the diamines or diamine mixtures. The preparation of polyimides based on benzhydroltetracarboxylic acids is described, for example, in EP-A 77,718.

The polyimides containing structural units of the formula I can also be obtained by catalytic hydrogenation of polyimides which contain at least 50 mol % of structural units of the formula Ia

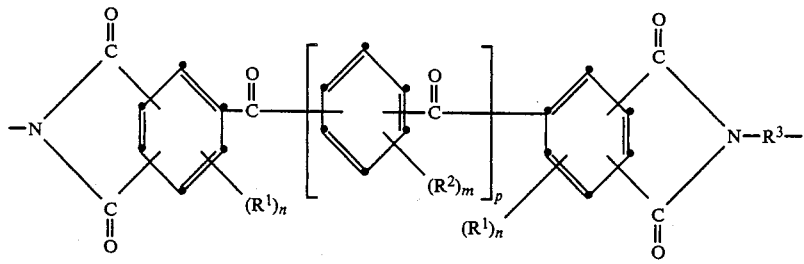

the radicals R¹, R² and R³ and the indices m, n and p are here as defined above. The invention also relates to this process. In this process R³ is preferably a residue of formula VIIIb as defined above.

The starting materials used are in general polyimides having a low to medium molecular weight; preferred starting polyimides have an inherent viscosity from 0.2 to 0.5 dl/g (measured at 25° C. on a 0.5% solution in NMP).

The catalytic hydrogenation is as a rule carried out in an inert solvent, for example in an ether such as tetrahydrofuran. The hydrogenation catalyst used is, for example, palladium-on carbon.

The reaction conditions and the catalysts to be used in a specific reaction are known per se and described, for example, in "Methoden der organischen Chemie (Methods of Organic Chemistry)", Vol. VI/Ib, Part 3, p. 50–60, G. Thieme (1984).

The inherent viscosity of polyimides which contain at least 50 mol % of structural units of the formula I is as a rule 0.1–1.0 dl/g (measured at 25° C. on 0.5% by weight solutions in NMP), preferably 0.2–0.7 dl/g and particularly preferably 0.3–0.5 dl/g.

The inherent viscosity of polyimides containing at least 50 mol % of structural units of the formula II is preferably 0.5–2.0 dl/g (measured at 25° C. on 0.5% by weight solutions in NMP) and with very particular preference 0.6–1.5 dl/g.

Preferably, the compositions according to the invention contain 50–1% by weight of components (a) and 50–99% by weight of components (b), the weight data relating to the total quantity of (a) and (b).

With very particular preference, the composition according to the invention contains 30–5% by weight of components (a) and 70–95% by weight of components (b), the weight figures relating to the total quantity of (a) and (b).

Using the compositions according to the invention, coatings of improved adhesion can be prepared, the photosensitivity of which is not unduly reduced as compared with the unmodified photosensitive polyimide layers; moreover, the two polymer components are compatible, so that homogeneous coatings result and no washing-out phenomena arise after development.

It is here a particular advantage that it is not absolutely necessary for the (co)-polyimides containing the structural element of the formula I to have the very high molecular weights of the unmodified photosensitive polyimides, which would be relatively difficult industrially to achieve.

The invention also relates to a coated material consisting of (i) a substrate and (ii) at least one superposed layer of a composition containing the components (a) and (b) as defined above.

Coating agents are used especially in the form of solutions of the mixtures according to the inventin from component (a), (b) and a solvent.

To prepare the material coated according to the invention, both components are advantageously dissolved in a suitable organic solvent, with heating if necessary.

Examples of suitable solvents are polar, aprotic solvents, which can be used alone or as mixtures of at least two solvents.

Examples of these are: ethers, such as dibutyl ether, tetrahydrofuran, dioxane, ethylene glycol, dimethylethylene glycol, dimethyldiethylene glycol, diethyldiethylene glycol and dimethyltriethylene glycol; halogenated hydrocarbons such as methylene chloride, chloroform, 1,2-dichloroethane, 1,1,1-trichloroethane and 1,1,2,2-tetrachloroethane; carboxylic acid esters and lactones such as ethyl acetate, methyl propionate, ethyl benzoate, 2-methoxyethyl acetate, γ-butyrolactone, δ-valerolactone and pivalolactone; carboxylic acid amides and lactams such as formamide, acetamide, N-methylformamide, N,N-dimethylformamide, N,N-diethylformamide, N,N-dimethylacetamide, N,N-diethylacetamide, γ-butyrolactam, ε-caprolactam, N-methylpyrrolidone, N-hexylpyrrolidone, N-acetylpyrrolidone, N-methylcaprolactam, tetramethylurea and hexamethylphosphoramide; sulfoxides such as dimethyl sulfoxide; sulfones such as dimethyl sulfone, diethyl sulfone, trimethylene sulfone and tetramethylene sulfone; tertiary amines such as trimethylamine, triethylamine, N-methylpyrrolidine, N-methylpiperidine and N-methylmorpholine; and substituted benzenes such as chlorobenzene, nitrobenzene, phenols or cresols.

Undissolved fractions can be removed by filtration, preferably pressure filtration. The concentration of polymer mixture in the coating agent thus obtained is preferably not more than 50% by weight, especially not more than 30% by weight and in particular not more than 20% by weight, relative to the solution.

In the preparation of the solutions, further conventional additives can be incorporated, which do not adversely affect the light sensitivity. Examples of these are matting agents, levelling agents, highly disperse fillers, flameproofing agents, fluorescent brighteners, anti-oxidants, stabilizers, light stabilizers, dyes, pigments, adhesion promoters and antihalo dyes, such as are described, for example, in U.S. Patent Specification No. 4,349,619.

The coating agent can be applied by conventional methods such as dipping, brushing and spraying processes, whirler coating, cascade coating and curtain coating, to suitable substrates or carrier materials.

The material is stable on storage, but advantageously should be protected from the action of light.

Examples of suitable carrier materials or substrates are plastics, for example hardened epoxide resins or polyimides, metals and metal alloys, for example iron, aluminium, copper, silver, gold or bronze, metalloids, for example bismuth, semiconductors, for example germanium, silicon or gallium arsenide, ceramics or other inorganic materials, for example $SiO_2$ or $Si_3N_4$.

The preferred carrier materials are metals, semiconductors or ceramics, in particular copper and silicon. The carrier materials in turn can be in the form of laminates, for example as a copper-laminated epoxide plate. Other preferred carriers are inorganic materials such as $SiO_2$ and $Si_3N_4$, and $SiO_2$ surfaces are particularly preferred.

The substrate surfaces are preferably provided with a suitable adhesion promoter before coating, since the good adhesion-promoting properties of the polyimide of the formula I as a rule do not manifest themselves until after heat treatment.

After coating, the solvent is removed, if necessary by heating and if appropriate in vacuo. This gives tack-free, dry and uniform films. Depending on the use, the films applied can have layer thicknesses of up to 100 μm and more.

It is then possible to produce relief images directly from such polyimide mixtures. The polymer layer of the material coated according to the invention has a rule a light sensitivity which is sufficient for numerous applications and is in some cases high, and the layer can be photocrosslinked directly. As a result of direct crosslinking under the action of radiation, low-molecular additives such as sensitizers can be avoided, and the protective layers, images and films have excellent electrical properties. The layers are also distinguished by high adhesive strength and thermal, mechanical and chemical resistance. In thermal aftertreatments, only slight shrinkage is observed, which has considerable advantages in use, because virtually no distortion of the images of structures is observed or because no internal strains arise in coatings and films.

Protective films of these polyimide mixtures can be further modified by heat or by the action of radiation, whereby, for example, even further improved adhesive strengths and heat stabilities are obtainable.

Protective films are as a rule produced by direct exposure, and the exposure times then depend essentially on the layer thickness and the light sensitivity and can be determined by those skilled in the art by means of conventional methods.

The photographic generation of the relief structures takes place as a rule by imagewise exposure through a photomask, followed by development with removal of the unexposed areas by means of a solvent or solvent mixture. The exposed protective film or the image produced are then stabilized, if appropriate, by further irradiation. This is followed as a rule by a thermal aftertreatment, the adhesion to the substrate being considerably enhanced. For this purpose, the sample is heat-treated in general above 150° C.; the temperatures in this step can be up to 300° C.

The invention also includes a process for the production of protective coatings, which comprises the steps of
 (i) coating of a carrier material with a composition containing components (a) and (b) defined above, with the use of an adhesion promoter if necessary,
 (ii) irradiating the coated material with actinic radiation, so that the polymer layer is crosslinked over its entire area,
 (iii) photochemical aftertreatment, if appropriate, and
 (iv) thermal aftertreatment.

The invention also relates to a process for producing relief structures, which comprises the steps of
 (i) coating a carrier material with a composition containing components (a) and (b) as defined above, if appropriate with the use of an adhesion promoter,
 (ii) irradiating the coated material with a pattern of actinic radiation, so that the irradiated areas of said polymer layer are crosslinked,
 (iii) developing the system with a suitable developer in a manner known per se, (iv) photochemical aftertreatment, if appropriate,
(v) thermal aftertreatment and
(vi) if appropriate, treatment of the coated substrate with an etching agent in a manner known per se.

Moreover, the invention relates to the protective coatings and relief images obtained by radiation-crosslinking.

The photostructuring or photocrosslinking can be initiated by actinic radiation, for example by UV light, X-rays, laser light or electron beams.

Examples of applications are protective, insulating and passivating coatings in electrical engineering and electronics, photomasks for electronics, textile printing and the graphical trade, as an etch resist for the production of printed circuits and printing plates and integrated circuits, relays for the production of X-ray masks, as a solder resist, as a dielectric for multi-layer circuits and as a structural element for liquid crystal displays.

The invention also relates to the use of the coated material defined above for the production of insulating, passivating and protective layers and of relief images. For these applications, the layer thickness of the polymer layer is preferably 0.5 to 100 μm, especially 1 to 50 μm and in particular 1 to 10 μm.

EXAMPLES

1. Preparation of Polyimides Containing Benzhydroltetracarboxylic Acid Radicals (Component a)

1.1. Preparation of Component (a) by Polycondensation

The isomer mixture of dimethyl 3,3',4,4'-benzhydroltetracarboxylate (BTDA-H$_2$) is prepared, in accordance with the instructions from "Proceedings of Second Int. Conf. on Polyimides", pages 75–85 (1985), and isolated.

Under nitrogen, 3.90 g of BTDA-H$_2$ (0.01 mol) and 2.54 g of 3,3',5,5'-tetramethyldiaminodiphenylmethane (0.01 mol) in 23 ml of NMP are then combined and heated to 180° C. After about 2 hours, elimination of methanol is no longer observed. The mixture is left for a further 2 hours at 200° C. and then cooled. After precipitation in water, washing and drying at 80° C. in vacuo, 5.2 g of polymer 1 are obtained, which dissolves readily in solvents such as N-methylpyrrolidone, 4-butyrolactone or cyclopentanone.

Physical data: T$_g$: 313–315° C.; η$_{inh}$(0.5% in NMP at 25° C.): 0.374 (dl/g);
NMR

6.23 ppm.

1.2 Preparation of Component (a) by Hydrogenation of Benzophenonetetracarboxylic Acid Dianhydride Polyimides According to EP-A-0,132,221 (Example 6), 4,4'-diamino-3,3',5,5'-tetramethyldiphenyl ketone is reacted with an equivalent quantity of benzophenonetetracarboxylic acid dianhydride and then cyclized to give the polyimide.

Physical data: T$_g$: 293–313° C.; η$_{inh}$ (0.5% in NMP at 25° C.): 0.246 dl/g; H-NMR (DMSO-d$_6$): benzophenonetetracarboxylic acid radical (6): 8.20–8.40 ppm; 4,4'-diamino-3,3',5,5'-tetramethyldiphenyl keton radical (4): 7.46 ppm; IR: imide carbonyls: 1720 cm$^{-1}$; diaryl ketones: 1666 cm$^{-1}$.

4 g of the polymer obtained are dissolved in 80 ml of THF and 800 mg of 5% Pd/C are added in a hydrogenation shaking apparatus. The reaction is allowed to proceed at 30–25° C. under H$_2$ at normal pressure. At the absorption values of 38 and 117% (referred to the theoretical amount), another 800 mg of catalyst are added each time, and the reaction is then stopped after 94 hours.

3.2 g of hydrogenated product are isolated by precipitation in water:

Physical data: η$_{inh}$ (0.5% in NMP at 25° C.): 0.21 dl/g; $^1$H-NMR: - benzhydroltetracarboxylic acid radical (6): 7.95–8.20 ppm;

benzhydroltetracarboxylic acid: 6.27 ppm; 77% of theory;

benzhydroltetracarboxylic acid: 6.76 ppm; 77% of theory; —(—CH$_2$—) from benzhydroltetracarboxylic acid: 4.46 ppm; 19% of theory; —4,4'-diamino-3,3',5,5'-tetramethyldiphenyl ketone radical (4): 7.37 ppm; 97% of theory;

from 4,4'-diamino-3,3',5,5'-tetramethyldiphenyl ketone: 6.12 ppm; 12% of theory;

from 4,4'-diamino-3,3',5,5'-tetramethyldiphenyl ketone: 6.57 ppm; 12% of theory;
IR: imide carbonyls: 1720 cm$^{-1}$; diaryl ketone: 1663 cm$^{-1}$.

The polymer has thus been hydrogenated selectively on the benzophenonetetracarboxylic acid radical, whereas the carbonyl group of the diamine radical is largely preserved.

2. Preparation of Photosensitive Layers from Polyimide Mixtures with Components (a)

2.1 A photoresist solution which—relative to the total solids content—contains 20% of component (a) is prepared in the following way:

Polyimide (component b) prepared from:
benzophenoneteracarboxylic acid dianhydride: 100%
1,4-diaminotetramethylbenzene: 55%
4,4'-diamino-3,3'-dimethyl-5,5'-diethyl diphenylmethane: 45%
η$_{inh}$ (0.5% in NMP at 25° C.): 0.97 (dl/g): 1.504 g
component (a) according to 1.1: 0.376 g
γ-butyrolactone: 18.120 g After filtration down to 0.45 μm, 1.0 μm thick coatings on wafer substrates can be produced with the solution obtained, when a speed of rotation of 4,250 rpm (20 seconds) is used.

2.2 A further photoresist solution analogously to 2.1 is prepared in the following way:

Polyimide prepared from:

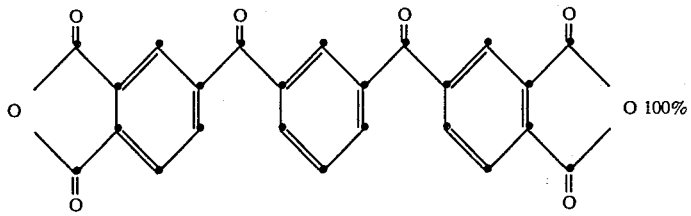

4,4'-diamino-3,3',5,5'-tetramethyldiphenylmethane: 100%
$\eta_{inh}$ (0.5% in NMP at 25° C.): 0.51 (dl/g): 0.757 g
component (a) according to 1.1: 0.189 g
N-methylpyrrolidone: 7.713 g After filtration down to 0.45 μm, 1.0 μm thick coatings can be produced on wafer substrates with the solution obtained, when a speed of rotation of 2,800 rpm (8 seconds) is used.

2.3 A photoresist solution which shows a relatively small sensitivity loss with respect to the added quantity of component (a), is prepared in the following way:
polyimide (component b) identical to Example 2.1 ($\eta_{inh}$=0.97 dl/g): 1.19 g
hydrogenated polymer (component a) from Preparation Example 1.2 ($\eta_{inh}$=0.21 dl/g): 0.51 g
γ-butyrolactone: 18.30 g After filtration down to 0.2 μm, 1.10 μm thick coatings can be produced on wafer substrates with the solution obtained, when a speed of rotation of 3,150 rpm (8 seconds) is used. Even after a storage period of 7 months at room temperature, this solution shows virtually unchanged processing conditions.

3. Preparation of Relief Structures Which Adhere to SiO$_2$ Layers Under Etching Conditions 3.1. Relief structures of 1.0 μm layer thickness are produced by the following process on silicon wafers which have a 1275 Å thick SiO$_2$ layer and have been stored for about 3 weeks after the oxidation:
I. Whirler-coating with a solution of γ-aminopropyltriethoxysilane as an adhesion promoter.
II. Whirler-coating with the solution under 2.1 at 4,250 rpm.
III. Drying at 90° C. for 30 minutes on a hotplate.
IV. Exposure by means of a mask-adjusting and exposure machine through a test mask containing highly resolved structures (with grooves and ridges of 2.0 and 3.0 μm width) and a total exposure energy of 1025 mJ/cm$^2$ relative to the 400 nm measuring probe from OAI, Optical Associates Inc.
V. Development by spraying on cyclopentanone, 18 seconds.
VI. Heating at 280° C. (15 minutes, 45 minutes heating-up phase) and cooling.
VII. Plasma purification in an O$_2$ plasma, 1 minute.
In the subsequent etching and stripping process:
dipping for 2 minutes and 30 seconds into a solution prepared from 100 ml of 40% hydrofluoric acid (HF) and 1000 ml of 40% NH$_4$F,
dipping into ethanolamine at 100° C. for 15 minutes, the following is observed:
(A) After dipping into the hydrofluoric acid etch solution, no disbonding of the 2.0 and 3.0 μm wide polyimide relief structures is observable.
(B) After stripping of the polyimide layer, clear etched patterns are visible in the SiO$_2$ layer, so that, even though the areas covered by the 2.0 and 3.0 μm wide ridges are narrowed, they are clearly visible as free-standing line structures.

3.2 Using the photoresist solution from preparation Example 2.2, relief structures of 1.0 μm layer thickness are produced on SiO$_2$ layers analogously to 3.1, with the difference from 3.1 that
whirler-coating is carried out 2,800 rpm,
exposure is carried out with a total exposure energy of 9,350 mJ/cm$^2$ and
development is carried out for 40 seconds with cyclopentanone, all other process steps being completely analogous to 3.1.

After the subsequent etching and stripping process, the following is again observed:
(A) After dipping into the hydrofluoric acid etch solution, no disbonding of the 2.0 and 3.0 μm wide polyimide relief structures is observable.
(B) After stripping of the polyimide layer, clear etched patterns are visible in the SiO$_2$ layer, so that, although the areas covered by the 3.0 μm wide ridges are narrowed, they are clearly visible as freestanding line structures.

3.3 After storage at room temperature for 7 months, the photoresist solution from Preparation Example 2.3. is used for producing relief structures of 1.10 μm layer thickness on silicon wafers coated with 1275 Å of SiO$_2$.

As distinct from 3.1., the following conditions are chosen:
The SiO$_2$-coated wafers which have been stored for a prolonged period are first purified in an O$_2$ plasma for 5 minutes.
The photoresist solution is whirler-coated for 8 seconds at 3,150 rpm.
Drying is carried out for 15 minutes at 90° C.
Development is carried out by spraying on cyclopentanone for 15 seconds.
The plasma purification is carried out for 30 seconds.
In the etching process, the wafers are dipped for 2 minutes and 15 seconds into a solution prepared from 100 ml of 40% hydrofluoric acid (HF) and 1000 ml of 40% NH$_4$F.

In other respects, the process is carried out completely analogously to 3.1.

However, an exposure energy of only 760 mJ/cm$^2$ is required in order to produce an exact polyimide image of the mask.

After dipping into the hydrofluoric acid etch solution, no disbonding of the 2.0 and 3.0 μm wide fine structures is detectable.

After stripping of the polyimide layer, clear etched patterns are visible in the SiO$_2$ layer, so that, although the areas covered by the 2.0 and 3.0 μm wide ridges are narrowed, they are clearly visible as free-standing line structures.

The edge of the etched patterns shows controlled lateral progress of the etching.

What is claimed is:

1. A composition comprising
   (a) at least one polyimide having an inherent viscosity of at least 0.1 dl/g (measured at 25° C. on a 0.5% by weight solution in N-methylpyrrolidone) and containing at least 50 mol % of structural units of the formula I

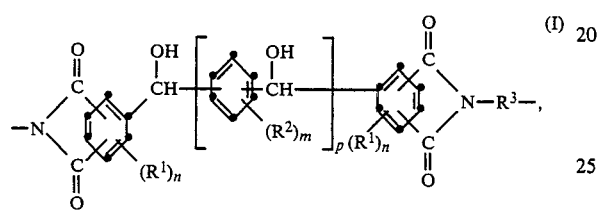

in which m and p independently of one another are integers from 0 to 4 and n is an integer from 0 to 3, $R^1$ and $R^2$ independently of one another are $C_1$–$C_6$-alkyl or $C_1$–$C_6$-alkoxy and $R^3$ is a divalent radical of an aromatic diamine which is substituted in at least one ortho-position relative to at least one N atom by alkyl, alkoxy, alkoxyalklyl, cycloalkyl or aralkyl or in which two adjacent C atoms of the aromatic radical are substituted by alkylene, and (b) at least one aromatic polyimide which is soluble in organic solvents and is photocrosslinkable and which contains at least 50 mol %, relative to the total quantity of diamine units in this component, of radicals as defined for $R^3$ and at least 50 mol %, relative to the total quantity of the aromatic tetracarboxylic acid units in this component, of tetravalent aromatic tetracarboxylic acid radicals including at least one benzophenone unit.

2. A composition according to claim 1, wherein component (b) is a polyimide or mixture of polyimides containing at least 50 mol % of structural elements of the formula II

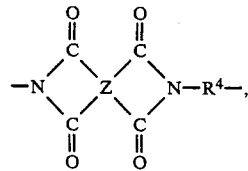

in which Z is a tetravalent aromatic radical of the formulae III, IV, V or VI or mixture thereof, wherein in each case two of the free valencies are bound in the ortho-position or peri-position relative to one another

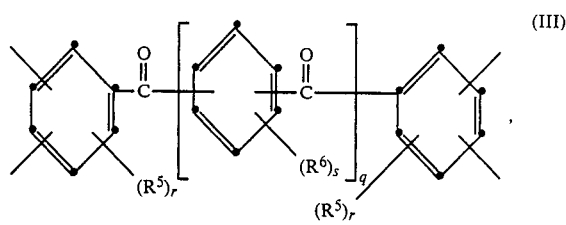

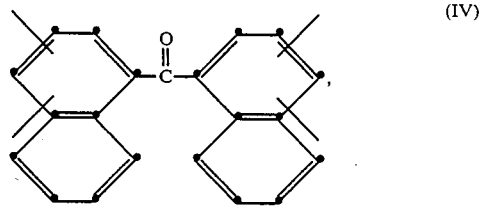

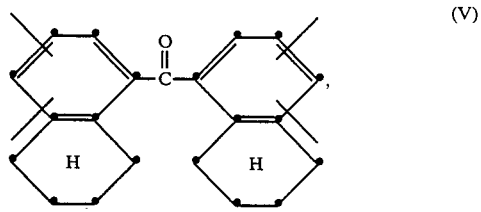

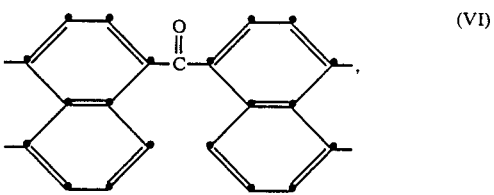

in which $R^5$ and $R^6$ independently of one another are $C_1$–$C_6$-alkyl or $C_1$–$C_6$-alkoxy, q and s independently of one another are integers from 0 to 4, r is an integer from 0 to 3 and $R^4$ is a divalent radical of an aromatic diamine which is substituted in two ortho-positions relative to at least one N atom by alkyl, alkoxy, alkoxyalkyl, cycloalkyl or aralkyl, or in which two adjacent C atoms of the aromatic radical are substituted by alkylene.

3. A composition according to claim 2, containing as the component (b) at least one polyimide which contains at least 90 mol % of structural elements of the formula II, in which Z is a radical of the formula IIIa, IIIb or IIIc or a mixture of these radicals

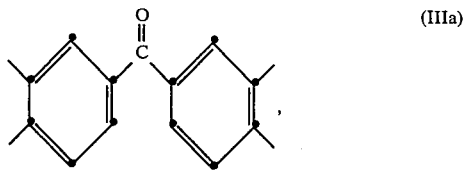

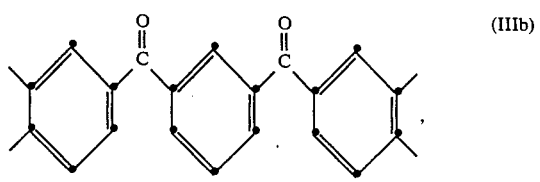

-continued

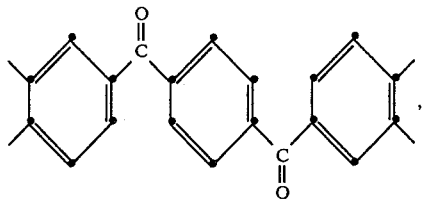
(IIIc)

and in which $R^4$ is a divalent radical of an aromatic diamine which is substituted in two ortho-positions relative to at least one N atoms by $C_1-C_6$-alkyl.

4. A composition according to claim 2, wherein $R^4$ is a radical of the formulae VII, VIII or IX or mixture thereof

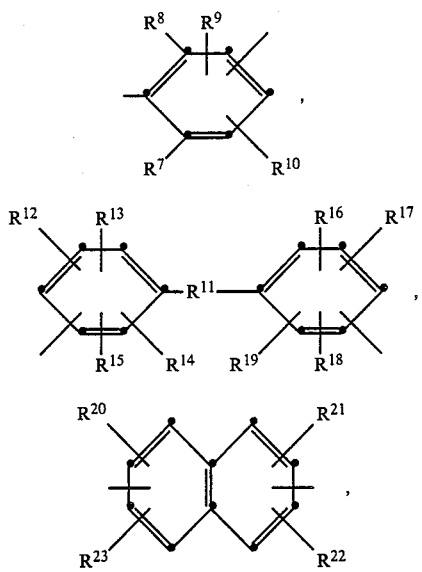

in which the radicals $R^7$ to $R^{10}$ and $R^{12}$ to $R^{23}$ independently of one another are hydrogen or $C_1-C_6$-alkyl and $R^{11}$ is a direct C—C bond, —$CH_2$—, —$C(CH_3)_2$—, —$C(CF_3)_2$—, —O—, —CO—or —$SO_2$—, with the proviso that each radical of the formula VII, VIII or IX carries at least two $C_1-C_6$-alkyl radicals which are bound in ortho-positions relative to a free valency.

5. A composition according to claim 2, containing as the component (b) a polyimide which contains at least 90 mol % of structural elements of the formula II, in which $R^4$ is a radical of the formulae VIIa, VIIb, VIIc or VIIIa or a mixture of such radicals

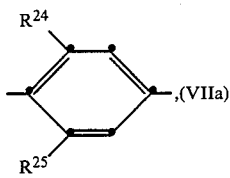
(VIIa)

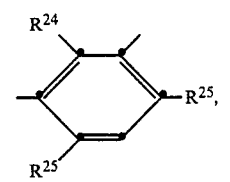
(VIIb)

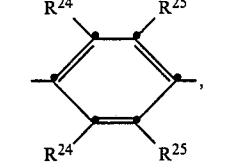
(VIIc)

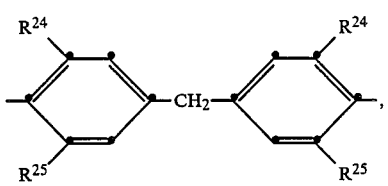
(VIIIa)

in which $R^{24}$ and $R^{25}$ are $C_1-C_6$-alkyl.

6. A composition according to claim 4, wherein p is 0 or 1, $R^3$ is a radical of the formula VIII according to claim 4 and $R^{11}$ is —CO—.

7. A polyimide containing at least 50 mol % of structural units of formula I according to claim 1, in which $R^3$ is a divalent radical of an aromatic diamine which is substituted in two ortho-positions relative to at least one N atom alkyl, alkoxy, alkoxyalkyl, cycloalkyl or aralkyl or in which two adjacent C atoms of the aromatic radical are substituted by alkylene.

8. A polyimide according to claim 7, consisting of recurring structural units of the formula I.

9. A polyimide according to claim 7, wherein $R^3$ is a divalent aromatic radical which is substituted in two ortho-positions relative to at least one N atom by $C_1-C_6$-alkyl or $C_1-C_6$-alkoxy.

10. A composition according to claim 1, containing 50-1% by weight of component (a) and 50-99% by weight of component b), the weight data relating to the total quantity of (a) and (b).

11. A polyimide according to claim 7, containing at least 50 mol % of structural units of the formula X, XI or XII or mixture thereof $$\text{(X)}$$

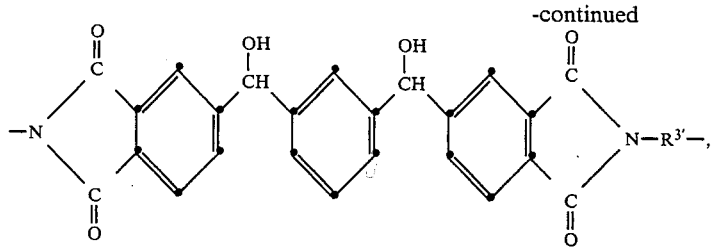

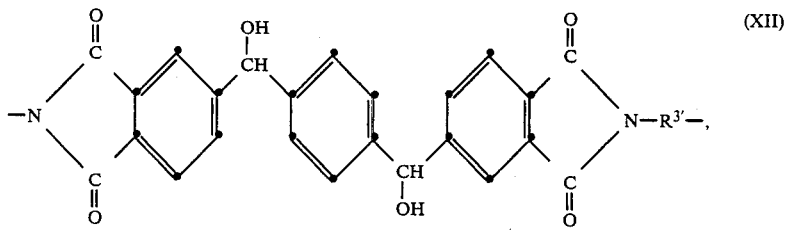

in which R³' is a divalent radical of an aromatic diamine which is substituted in two ortho-positions relative to at least one N atom by alkyl, alkoxy, alkoxyalkyl, cycloalkyl or aralkyl, or in which two adjacent C atoms of the aromatic radical are substituted by alkylene.

12. A polyimide according to claim 7 wherein R³ is a radical of formula VII, VIII or IX or mixture thereof

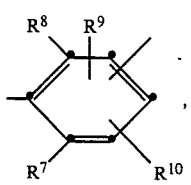

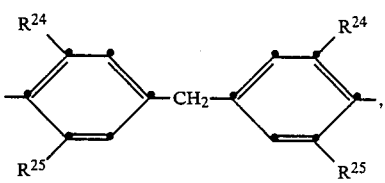

in which the radicals R⁷ to R¹⁰ and R¹² to R²³ independently of one another are hydrogen or $C_1$-$C_6$-alkyl and R¹¹ is a direct C—C bond, —CH₂—, —C(CH₃)₂—, —C(CF₃)₂—, —O—, —CO— or —SO₂—, with the proviso that each radical of the formula VII, VIII or IX carries at least two $C_1$-$C_6$-alkyl radicals which are bound in ortho-positions relative to a free valency.

13. A polyimide according to claim 7, wherein R³ is a radical of formula VIIa, VIIb, VIIc or VIIIa or mixture thereof

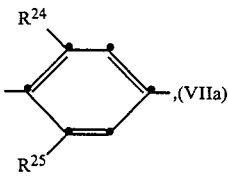

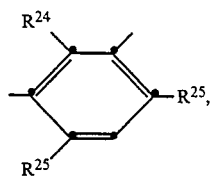

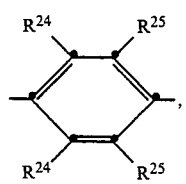

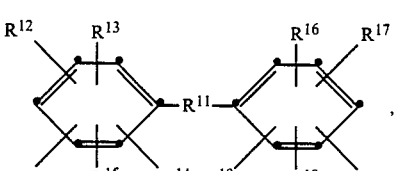

in which R²⁴ and R²⁵ are $C_1$-$C_6$-alkyl.

14. A polyimide according to claim 7, wherein R³ is a radical of formula VIII in which R¹² to R¹⁹ independently of one another are hydrogen or $C_1$-$C_6$-alkyl and R¹¹ is —CO—, with the proviso that the radical of formula VIII carries at least two $C_1$-$C_6$-alkyl radicals which are bound in ortho-positions relative to a free valency.

* * * * *